US010348250B2

(12) United States Patent
Dempsey

(10) Patent No.: US 10,348,250 B2
(45) Date of Patent: Jul. 9, 2019

(54) AMPLIFIER WITH NOISE CONTROL AND A DIGITAL TO ANALOG CONVERTER WITH REDUCED NOISE BANDWIDTH

(71) Applicant: Analog Devices Global Unlimited Company, Hamilton (BM)

(72) Inventor: Dennis A. Dempsey, Newport (IE)

(73) Assignee: Analog Devices Global Unlimited Company, Hamilton (BM)

(*) Notice: Subject to any disclaimer, the term of this patent is extended or adjusted under 35 U.S.C. 154(b) by 0 days.

(21) Appl. No.: 15/790,793

(22) Filed: Oct. 23, 2017

(65) Prior Publication Data

US 2019/0123692 A1    Apr. 25, 2019

(51) Int. Cl.
H03F 1/26    (2006.01)
H03F 1/02    (2006.01)
H03F 1/42    (2006.01)
H03M 1/66    (2006.01)

(52) U.S. Cl.
CPC .............. *H03F 1/26* (2013.01); *H03F 1/0205* (2013.01); *H03F 1/42* (2013.01); *H03M 1/66* (2013.01); *H03F 2200/129* (2013.01); *H03F 2200/171* (2013.01); *H03F 2200/372* (2013.01)

(58) Field of Classification Search
USPC ........................................ 330/294, 192, 149
See application file for complete search history.

(56) References Cited

U.S. PATENT DOCUMENTS

| | | | |
|---|---|---|---|
| 4,584,559 A * | 4/1986 | Penney | G11C 27/026 327/91 |
| 5,642,078 A | 6/1997 | Navabi et al. | |
| 6,392,578 B1 | 5/2002 | Russell | |
| 6,414,616 B1 | 7/2002 | Dempsey | |
| 6,567,026 B1 | 5/2003 | Gorman | |
| 6,885,328 B1 | 4/2005 | Kao et al. | |
| 7,173,547 B2 * | 2/2007 | Baechtold | G11C 29/48 341/118 |
| 7,369,385 B2 | 5/2008 | Brennan et al. | |
| 7,688,240 B2 | 3/2010 | Jain et al. | |
| 7,982,581 B2 | 7/2011 | Jha et al. | |
| 8,284,014 B2 | 10/2012 | Jha | |
| 8,606,311 B2 | 12/2013 | He et al. | |
| 8,620,242 B2 * | 12/2013 | Mirzaei | H03F 1/0277 455/115.1 |
| 9,768,800 B1 | 9/2017 | Nguyen | |
| 9,843,260 B1 * | 12/2017 | Paek | H02M 3/158 |
| 2004/0248528 A1 | 12/2004 | Rozenblit et al. | |

(Continued)

OTHER PUBLICATIONS

Reisiger, Mark, "Reduce amplifier noise peaking to improve SNR", electronic design technologies, (Oct. 2, 2012), 13 pgs.

(Continued)

*Primary Examiner* — Hieu P Nguyen
(74) *Attorney, Agent, or Firm* — Schwegman Lundberg & Woessner, P.A.

(57) ABSTRACT

The noise power of an amplifier or buffer can increase towards the unity gain crossover frequency of the amplifier. The inventor realized that many applications do not require the full bandwidth capability of the amplifier all of the time and hence step could be taken to reduce the bandwidth at the output of the amplifier and hence the noise power can be reduced when appropriate, taking other operating requirements into consideration.

20 Claims, 11 Drawing Sheets

FIG. 1

(56) References Cited

U.S. PATENT DOCUMENTS

2014/0340150 A1 11/2014 Dempsey et al.
2018/0152174 A1* 5/2018 Zanbaghi ................ G11C 7/04

OTHER PUBLICATIONS

Yeknami, Ali Fazli, "A Variable Bandwidth Amplifier for a Dual-mode Low-Power ?S Modulator in Cardiac Pacemaker System", Proceedings of the IEEE International Symposium on Circuits and Systems (ISCAS), 2013, (2013), 4 pgs.

"International Application Serial No. PCT EP2018 078654, International Search Report dated Feb. 25, 2019", 4 pgs.

"International Application Serial No. PCT EP2018 078654, Written Opinion dated Feb. 25, 2019", 9 pgs.

Jorgen, Andreas Michaelsen, "Suppression of delta-sigma DAC quantisation noise by bandwidth adaptation", Integrated Circuits And Systems Design, (Sep. 3, 2007), 16 pgs.

Trescases, Olivier, "A Low Power Mixed-Signal Current-Mode DC-DC Converter Using a One-bit Delta Sigma DAC", IEEE 21st Annual Applied Power Electronics Conference and Exposition (APEC), (Mar. 19, 2006), 6 pgs.

* cited by examiner

AMPLIFIER WITH NOISE CONTROL AND A DIGITAL TO ANALOG CONVERTER WITH REDUCED NOISE BANDWIDTH

FIELD

The present disclosure relates to an amplifier, such as a buffer amplifier, having controllable speed and hence controllable noise, and the combination of a digital to analog converter and an amplifier where the speed or bandwidth of the amplifier can be adjusted to trade responsiveness against noise.

BACKGROUND

Digital to analog converters are devices that accept a digital code and convert it to an analog quantity, typically an analog output voltage but some converters are arranged to provide analog currents or packets of charge. It is further known by the person skilled in the art that given a known current one can produce a known voltage, and that given a known voltage one can produce a known current. In, for example, voltage based digital to analog converters it is generally desirable to ensure that the output voltage of the digital to analog converter is not effected by the electrical characteristics, such as impedance, of a circuit being driven by the digital to analog converter. It is therefore known to provide buffer amplifiers in association with digital to analog converters where the buffer amplifier is responsible for driving the load. Desirably the buffer presents a substantially constant load to the digital to analog converter. More generally buffer amplifiers can be provided whenever it is desired to amplify a signal or to provide an impedance transformation for example from a high impedance to a low impedance, or to separate a circuit from the effects of a load that may be coupled to the circuit or the voltages at which the load operates. The provision of a buffer amplifier may help the system designer better achieve the competing requirements of providing a low noise, fast settling, digital to analog converter while seeking to keep power consumption low.

SUMMARY OF THIS DISCLOSURE

Introducing a buffer amplifier introduces a new source of error and/or noise and can also introduce a new mechanism for the introduction of perturbations into the signal path. For example the amplifier may receive power over a supply rail that includes undesirable artefacts, such as high frequency components from a clock also sharing the supply rail, which can propagate into the signal path by way of the amplifier. Furthermore the spectral content of that noise can vary in an undesirable way. It would be advantageous to be able to reduce the noise generated by the buffer amplifier, or more generally the noise output from the DAC and buffer combination. It may also be desirable to reduce the impact from artefacts propagating though the amplifier.

In accordance with a first aspect of this disclosure there is provided an amplifier and a controller for controlling a bandwidth of the amplifier so as to control the noise power at the output of the amplifier, where the controller is responsive to a change in the signal driving the amplifier.

In accordance with a second aspect of this disclosure, there is provided a digital to analog converter in combination with an amplifier. The amplifier can act as an output buffer or may be further downstream of the digital to analog converter in a signal processing chain.

The inventor realized that controlling the noise spectrum of the amplifier also provided an opportunity to control the noise bandwidth of circuits preceding the amplifier, including the DAC.

By controlling the bandwidth of the amplifier, which may for example be an output buffer, the amount of noise power introduced into a circuit being driven by the combination of a digital to analog converter and the amplifier can be controlled.

Indeed bandwidth control also modifies the contribution of other noise sources in the signal processing chain, such as noise from a voltage reference connected to the DAC or to the buffer. It also controls the content of unwanted artefacts, such as unwanted signals propagating through other signal paths, examples of which may include noise or interference on the power rails supplying the amplifier. This control may be implemented based on the properties of the signal being output by the digital to analog converter.

The bandwidth control may be implemented using a number of methods. In some amplifiers the bandwidth control may be implemented by including a filter at the output of the amplifier. Alternatively, the bandwidth may be varied by controlling the transconductance of one or more of the stages or transistors within the amplifier. This can be achieved by modifying the values of quiescent currents within transistors or amplifier stages. This may also be done, for example, by controlling the number of transistors of a current mirror that are operative to sink current from or to supply current to a differential pair of transistors. Bandwidth control can also be achieved by varying the effective width of transistors within the amplifier, by providing transistors in parallel or series that can be switched or coupled into or out of a circuit of the buffer. Providing a change in the effective width of a transistor changes its transconductance.

In some amplifier topologies the path from input to output may involve a plurality of stages in parallel. Such a topology exists in feed forward amplifiers. In such circumstances bandwidth control may be achieved by adjusting the parameters, such as transconductance of one or more of the stages.

According to a third aspect of this disclosure there is provided a method of controlling noise power at the output of an amplifier, the method comprising adjusting the bandwidth of the amplifier to reduce noise when an input to the amplifier is substantially constant, and increasing the bandwidth when a change in the input signal occurs or to facilitate such a change, or when conditions at the output of the amplifier change.

The control of the bandwidth may be performed by a state machine or by a suitably programmed data processor. Where the amplifier is downstream of a digital to analog converter the state machine or processor may be responsive to changes in a digital signal supplied to the digital to analog converter so as to change the bandwidth in preparation for or in response to a change at the output of the digital to analog converter.

In some implementations of the method, the change in bandwidth may be predetermined. For example the bandwidth may be set to either a first or "high" bandwidth or to a second or "low" bandwidth. The time for which the amplifier is operated at the first bandwidth as a result of the change in the input signal may be predetermined, for example as a settling time of the amplifier or of the settling time of the digital to analog converter driving the amplifier or as time based on the responsiveness of the amplifier and the circuit driving it. However in other implementations the controller may be arranged to examine the signal frequency content provided to the amplifier, for example from the output from the digital to analog converter or from analysis of the data (e.g. words) being provided to the input of the digital to analog converter, and select the bandwidth, and the optionally time for which the amplifier is held at a given bandwidth, based on the frequency content of the signal presented to the amplifier. The frequency content of the signal may be measured or estimated (for example by a digital signal processor), or it may be assumed or it may be known from knowledge of operating conditions of a system or circuit driving the amplifier. The bandwidth may be adjusted over more than two steps or levels, for example 4, 8, 16, 32, 64 levels or more (and not limited to binary numbers) or may be adjusted on a substantially continuous (not discrete) basis.

According to a further aspect of this disclosure there is provided a method of controlling noise power at the output of an amplifier, the method comprising adjusting the bandwidth of the amplifier to reduce noise when conditions at an output of the amplifier are substantially constant, and increasing the bandwidth to facilitate a change at the output.

Thus, for example, the amplifier may include circuits or other means arranged to monitor for perturbations in the output voltage or output current. If, for example, the output current or output voltage changed more quickly than a predetermined rate of change, as might be the case if a load capacitance discharged as a result of switching activity at or associated with the load, then the amplifier can respond by increasing its bandwidth. This enables the feedback loop around the amplifier to regain control of the output node. Once the voltage or current has been stabilized then the amplifier bandwidth can be reduced so as to modify (reduce) the amount of noise being propagated in to subsequent circuits. Such knowledge of perturbations in the output current may come from other circuits in the signal processing path associated with the amplifier or from thermal data which can be used to infer a change in the activity of some parts of the signal chain.

BRIEF DESCRIPTION OF THE DRAWINGS

Embodiments of the present disclosure will now be described, by way of non-limiting example only, with reference to the accompanying Figures, in which.

DESCRIPTION OF SOME EMBODIMENTS OF THIS DISCLOSURE

Figure 1:
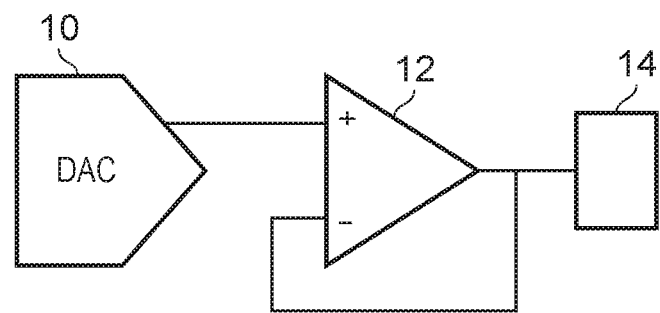
FIG. 1 is a schematic diagram of a single ended digital to analog converter in combination with a unity gain buffer.

Digital to analog converters are useful in many circumstances where a signal has to be converted between the digital and analog domains. Uses of digital to analog converters include audio processing circuits, video circuits, industrial controllers, actuator systems, motor controllers and a whole host of other uses. Digital to analog converters may be implemented using many technologies. The teachings of this disclosure are not limited to use with any particular digital to analog converter technology. The digital to analog converter, generally designated 10 in FIG. 1 can be used to provide an output voltage which may need to be provided to a load device 14 whose impedance may not be well defined. Alternatively the load device 14 may require a current to flow at its input which would be detrimental to the operation and accuracy of the digital to analog converter 10. A digital to analog converter 10 can be associated with a buffer amplifier 12 such that the buffer shields the digital to analog converter 10 from the impedance of the load. Furthermore the buffer 12 may provide voltage gain and may also be arranged to pass current in excess of the capability of the digital to analog converter 10. For simplicity the buffer 12 has been drawn in a unity gain configuration in FIG. 1. However buffers may be arranged to provide gains of less than 1 or more than 1 and may also be configured in inverting as well as non-inverting (as shown) configurations. Furthermore, where the digital to analog converter 10 is a current mode device the buffer 12 may further be arranged to perform a current to voltage conversion. Although a single ended system has been illustrated for diagrammatic simplicity, the teachings of this disclosure also apply to differential DACs and dual ended amplifiers, and to DACs and buffer amplifiers using single supply voltages or multiple supply voltages on multiple supply rails.

Many amplifiers exhibit an increase in voltage noise spectral density as they approach their unity gain crossover frequency. This increase in noise spectral density can be referred to as "noise peaking" and can be troublesome in low noise, low gain circuits such as buffers or voltage followers. The effect at or near the amplifier unity gain frequency is often outside of the system bandwidth and/or masked by (buried beneath) the noise floor of many amplifiers or of other devices in the signal chain. However in precision and low noise applications, this effect can become more relevant and this noise peaking can be the dominant noise contribution.

Figure 2:
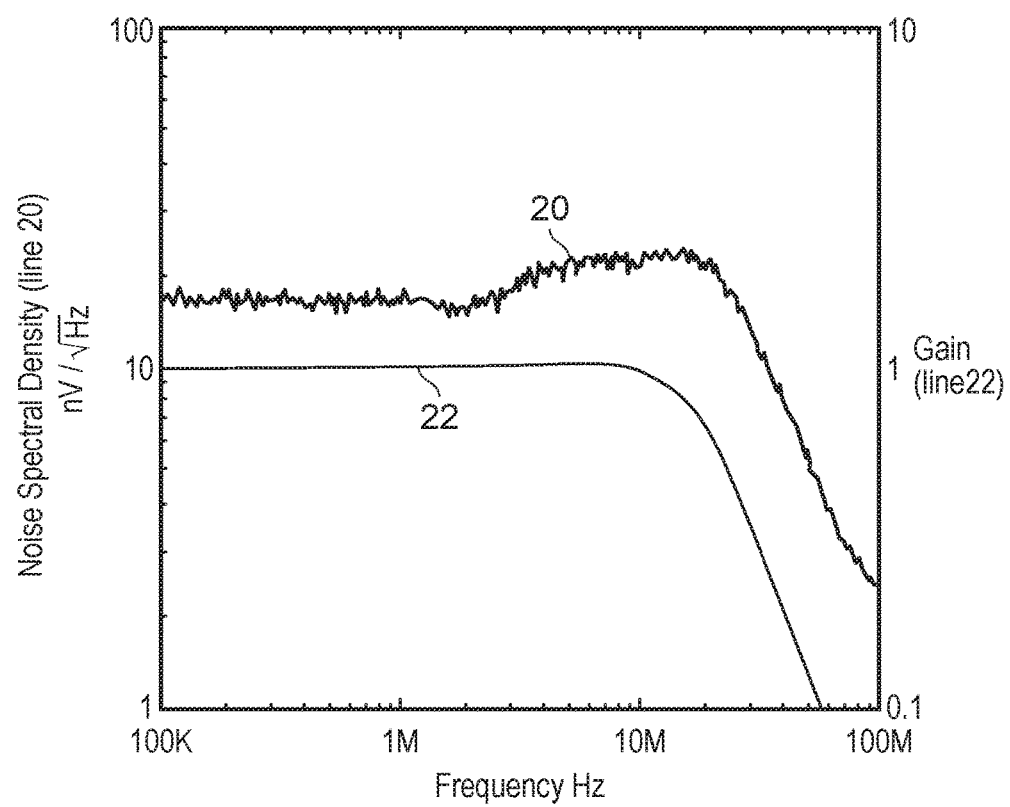
FIG. 2 is a plot of noise spectral density versus frequency (line 20) and gain versus frequency (line 22) for a commercially available operational amplifier (AD823)

FIG. 2 schematically illustrates the noise spectral density, shown as line 20, as a function of frequency response for an amplifier set up as a unity gain buffer with a low pass frequency response of DC up to a turnover frequency (as represented by a 3 dB reduction in power at the output) of 16 MHz as represented by the line 22 in FIG. 2. In measurements the noise floor is around 16 nV/√Hz at 100 KHz. It can be seen that the noise spectral density starts to increase at around 2 MHz and contains significant noise power up to about 30 MHz. This need not or may not be a problem if the low pass system bandwidth of the system including the amplifier is significantly lower than e.g. less than 1 MHz as the noise falls significantly outside of that bandwidth. These figures were measured for the Analog Devices AD823 and were published at http://electronicdesign.com/analog/reduce-amplifier-noise-peaking-improve-snr, are related to an article published in October 2012. The AD823 is a high performance device, and in many amplifiers the noise peaks are between 50% to 200% greater than the amplifier's noise floor. It should be noted that FIG. 2 is a log-log plot and hence the apparent size of the noise peak (both in terms of height and width) is compressed by the logarithmic nature of the plot. Had one or both of the scales been represented as linear, then the noise contribution of the noise peak would be visually more significant.

This noise peaking occurs because most amplifiers are designed such that the input stage of the amplifier dominates the amplifier performance within the useful low frequency signal bandwidth. Thus whilst all of the transistors in the amplifier contribute noise, the noise from the later stages is reduced by the application of negative feedback. In principle, by using feedback any gain greater than unity that precedes a source of noise will reduce the input referred noise that is contributed to the amplifier by that source. Generally there is plenty of gain ahead of all the transistors except those at the input stage. It is for this reason that the contribution by the output stage transistors is generally modest and the noise contribution of the input stage dominates. However, as the frequency increases and tends towards the amplifier unity-gain crossover frequency the gain reduces and there becomes insufficient gain left with which to suppress noise generated by the transistors inside of the amplifier. Thus noise at these frequencies is propagated to the output with a magnitude greater than the low frequency noise floor of the amplifier.

Figure 3:
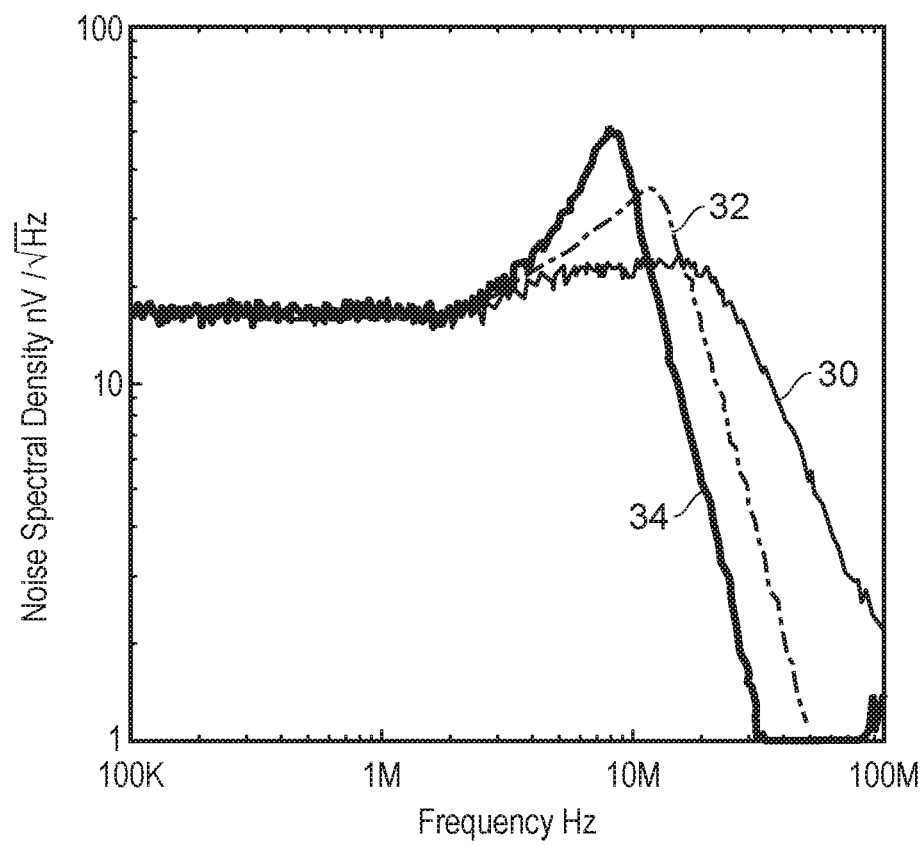
FIG. 3 is a graph illustrating how the noise spectral density can be adversely affected by the choice of output load connected to the amplifier.

The feedback loop around the amplifier controls amplifier stability and in conjunction with the finite gain and frequency response of the amplifier affects noise peaking. As the frequency increases the phase margin around the feedback loop degrades. The signals near the unity gain crossover frequency are fed back more in phase with the incoming signal, and this causes the closed loop noise power characteristic to peak near the unity gain crossover frequency. Furthermore, as shown in FIG. 3, the noise spectral density can be degraded by capacitance at the output of the amplifier. FIG. 3 shows plots of noise spectral density versus frequency for the same amplifier, but now with capacitive loads of 8 pF, 220 pF and 470 pF as designated by lines 30, 32 and 34, respectively, showing how the noise peak can be greatly increased by such a capacitive load. This noise peak is, of course, introduced into downstream devices connected to the buffer amplifier and may serve to degrade the signal to noise performance of the signal chain formed by such devices downstream of the amplifier. The introduction of further noise is highly undesirable. Somewhat ironically, some designers deliberately connect a capacitive load directly to the output of the amplifier in the belief that it improves the noise performance of the amplifier. By adding such a capacitive load the designer can mistakenly introduce the degradation of the signal to noise performance by way of the mechanism described above.

Many digital to analog converter applications place emphasis on the frequency response and linearity of the digital to analog converter and it is often for this reason that the unity gain buffer configuration is chosen as the person skilled in the art would naturally expect such a configuration to do as little damage as possible to the linearity and bandwidth performance which the digital to analog converter circuit, as such, provides at its output. Limited bandwidth can cause signal distortion and hence wide bandwidth solutions are often used in signal processing applications. It is therefore counter intuitive to take steps to reduce the buffer bandwidth.

Figure 4:
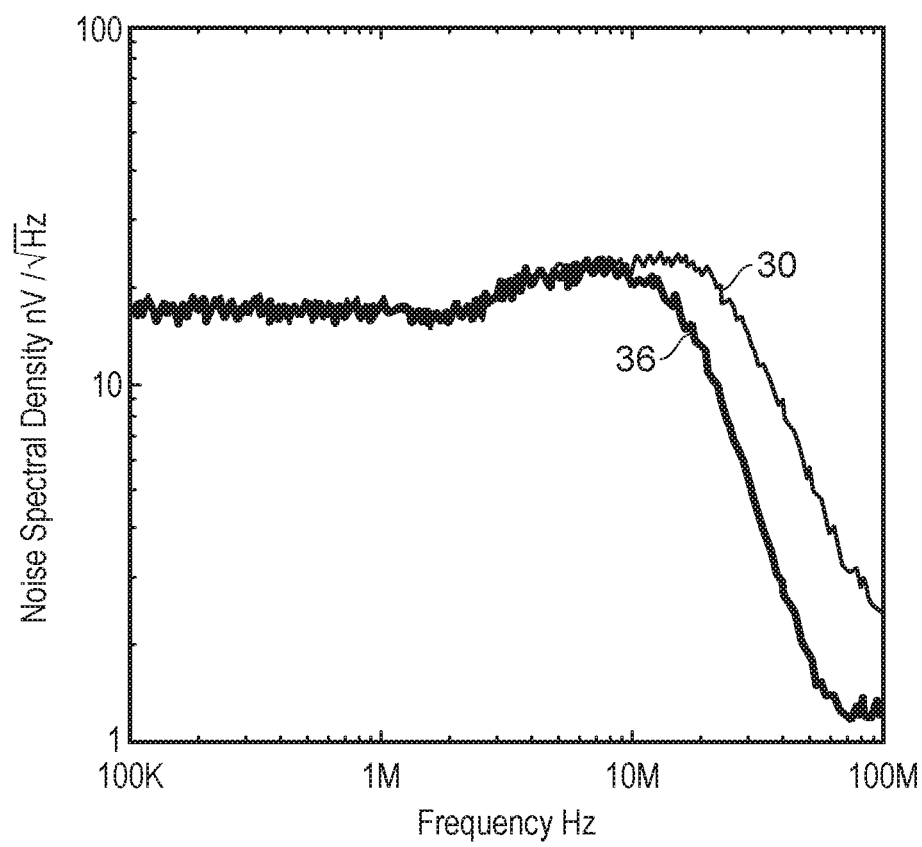
FIG. 4 is a graph illustrating how the noise spectral density can be modified by the inclusion of a low pass filter.

FIG. 4 is a graph showing the noise spectral density improvement that can be obtained by forming a low pass filter at the output of the buffer, and it can be seen that the performance where the low pass filter comprises a 102 Ohm resistor in combination with the 56 pF load as shown by line 36 is far superior to the noise performance where the buffer is loaded by an 8 pF load as shown by line 30 (in FIGS. 3 and 4).

Figure 5:
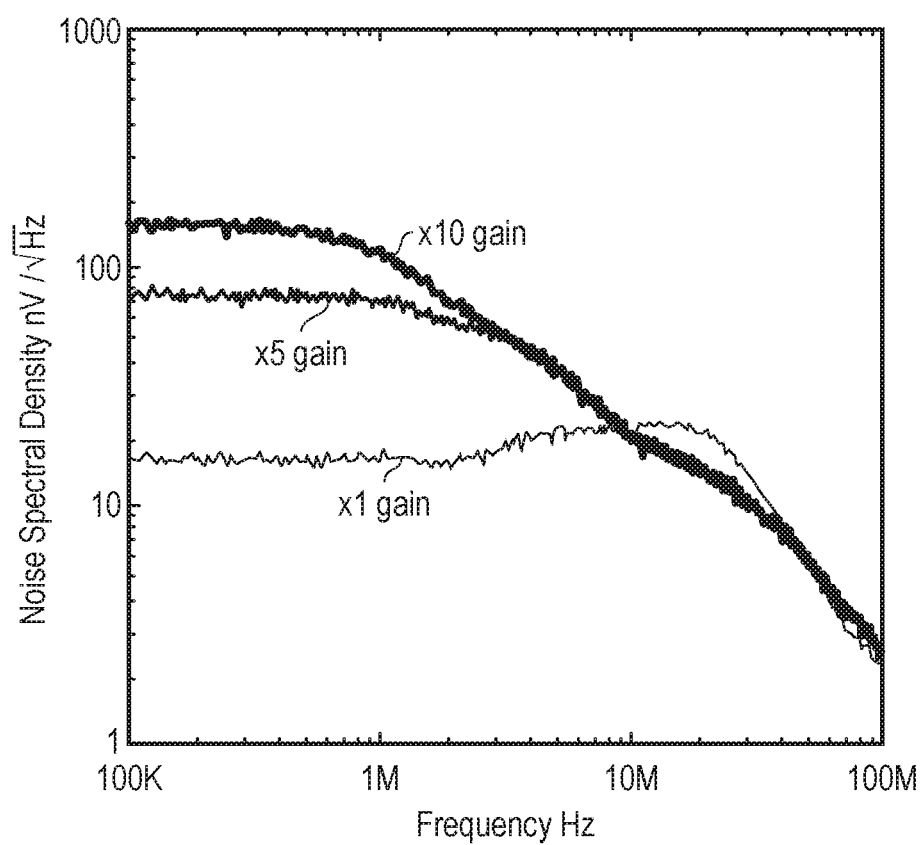
FIG. 5 is a graph illustrating how the noise spectral density can be affected by the gain as set by the feedback loop of the amplifier.

For completeness, FIG. 5 has been included which demonstrates that as the gain of the amplifier/buffer is increased from unity gain then the noise peaking around the 3 dB point becomes less pronounced as the noise from the input stage begins to dominate. The inventor realized that whilst the high bandwidth performance from the buffer amplifier is desirable when the signal being processed by the amplifier has significant amounts of high frequency content, for example when the output of the digital to analog converter is changing rapidly, because of a high frequency content or because of a high slew rate demand or short settling time demand, it is often not required all of the time. In many circumstances the digital to analog converter may be used to set a reference voltage and then be held at that reference voltage for a prolonged period of time. In other cases the amplifier and DAC may be shared or time multiplexed with different requirements in terms of speed and noise being desirable for different loads or modes of operation. Under these circumstances a large bandwidth at the buffer is not required or not required all of the time and hence it becomes possible to take steps to reduce the bandwidth, and hence the noise. Similarly, not all applications exploit the full capability of the amplifier/buffer or, where the buffer is in combination with a digital to analog converter, the full capabilities of the digital to analog converter all of the time. It therefore becomes possible to perform a frequency analysis or time domain analysis of the signals being processed by the digital to analog converter and to use that analysis, optionally together with slew rate analysis, to modify the small signal bandwidth of the buffer (as opposed to its slew rate—which can be increased by slew rate boosting circuits which effectively turn on to pass additional current to an output node if the difference between the actual voltage at the node and its target voltage exceeds a threshold) so as to reduce the bandwidth to a bandwidth which still gives an acceptable frequency response for the circuit, but which reduces the overall noise power introduced by the buffer. In essence a bandwidth controller trades noise against speed and optionally against power consumption and seeks to make an appropriate compromise based on the constraints. For example power consumption may be prioritized in a system that has entered a low power mode, whereas noise reduction may be prioritized when the signal is static or of limited bandwidth. A high small signal bandwidth may be prioritized if operating conditions suggest that a more rapid response or reduced settling time is desired. Techniques based on assumptions about, or application knowledge of, the required bandwidth may also be used.

Figures 1, 6:
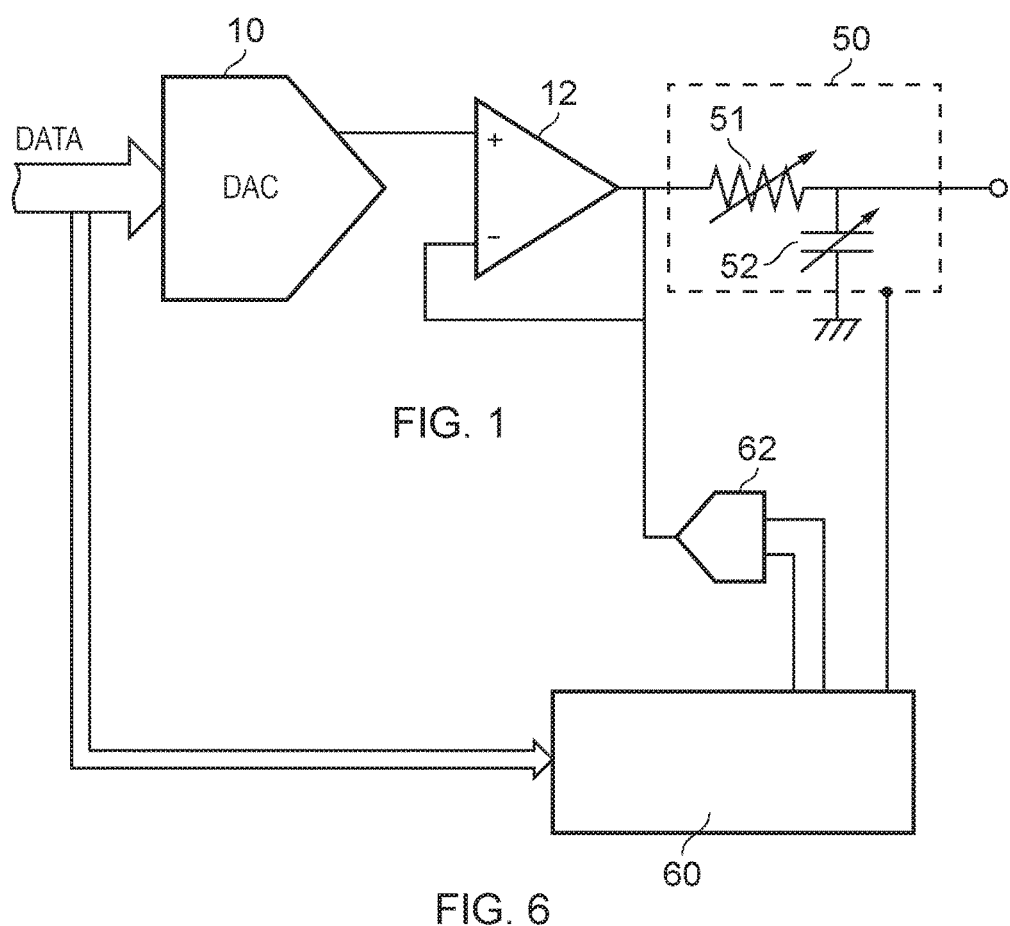
FIG. 6 schematically illustrates an embodiment of a digital to analog converter in combination with a buffer amplifier in accordance with the teachings of this disclosure.

FIG. 6 is a circuit diagram of a digital to analog converter 10 in combination with a buffer 12 having a variable bandwidth, in this example implemented by an output stage low pass filter 50, under control of a controller 60. The controller 60 may be responsive to the digital input provided to the digital to analog converter 10, or be responsive to a measurement of the signal at the input or output of the buffer 12, or a combination of these. Measurement of the analog signal at the output of the buffer 12, or indeed at the input of the buffer, may be made by an analog to digital converter 62. By either of these approaches the controller 60 can be responsive to changes in the output of the digital to analog converter 10 and can also if desired perform a frequency or time domain, for example slew rate, analysis to decide what bandwidth might be acceptable for the filter 50. The filter 50 has been shown as comprising a resistor 51 and capacitor 52 arranged in a low pass filter combination. One or both of the resistor and capacitor may be variable. This could be done in an analog manner, for example by the use of a varactor as a capacitor, but for flexibility and ease of control is more likely to be implemented in a digitally controlled manner where the capacitance and/or the resistance can be controlled between discrete values. Digitally variable resistances can be used, such as for example in U.S. Pat. No. 6,885,328. Where an ADC 62 is used to monitor the output of the amplifier, then the ADC may also be used to measure or estimate the noise contribution to the output signal. The ADC output signal can be processed to provide an indication of the noise or other interference that has been added to the nominal output signal, and this information can be used by the controller to set the amplifier and/or filter bandwidth. This bandwidth setting may take account of the input signal bandwidth such that the amplifier and/or filter bandwidth can be dynamically adjusted to target responsiveness versus noise performance.

Figure 7:
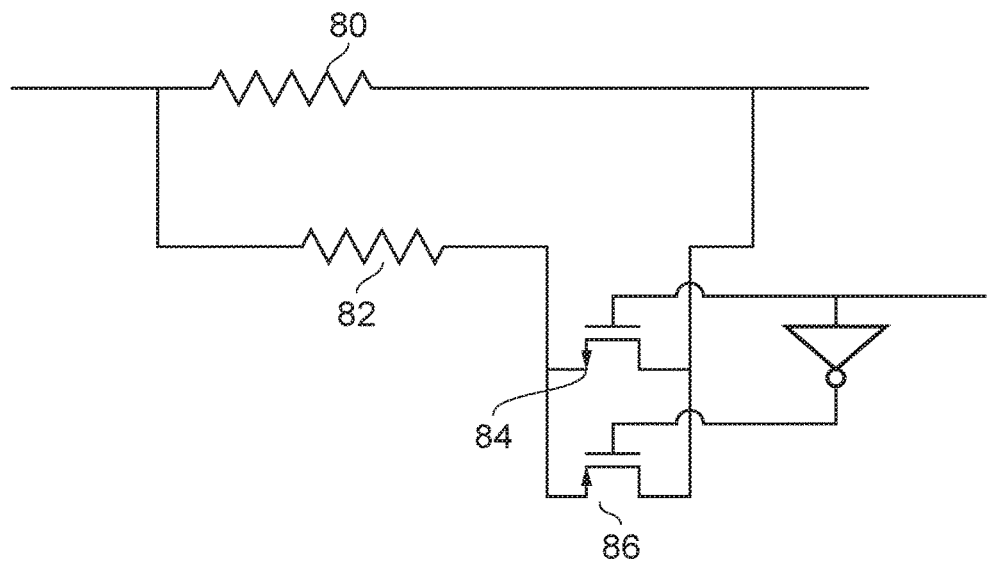
FIG. 7 schematically illustrates a variable resistor (available as a digital potentiometer under the trade name "digipot" from Analog Devices) which may be included in the low pass filter.

FIG. 7 schematically illustrates an arrangement where the resistor 51 comprises a first resistor 80 provided in parallel with a second resistor 82. A switch, which may be formed as a single transistor or, as shown here by an NMOS transistor 84 and a PMOS transistor 86 arranged in parallel with each other but in series with resistor 82 can be provided such that the resistor 82 can be effectively be switched between being in parallel with resistor 80 and being disconnected from resistor 80. This circuit gives two levels of resistance which can be used to set the break-point of the low pass filter between first and second predetermined values. Additional resistors and switched can be provided to provide more levels of bandwidth control.

Figure 8:
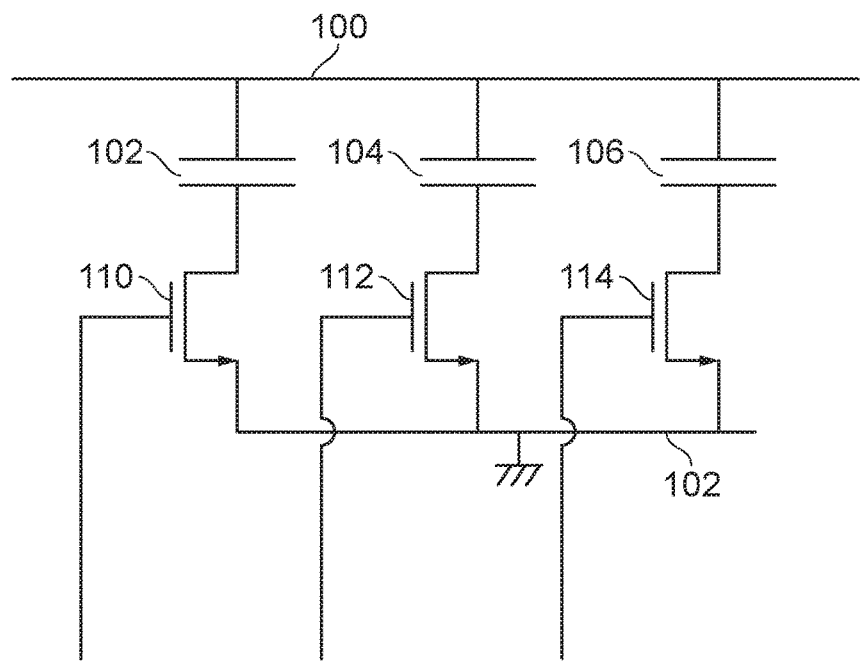
FIG. 8 schematically illustrates a variable capacitor in the form of a digitally adjustable capacitance which may be included in the low pass filter.

Additionally or alternatively it may also be desirable to vary the capacitance of the capacitor 52. FIG. 8 shows an arrangement where three capacitors 102, 104 and 106 (although it could be more or fewer) are arranged in parallel and can be selectively connected between a common conductor 100 and ground 102 by way of respective N-type field effect transistors 110, 112, and 114. If the capacitors are binary weighted, then this provides the ability to connect capacitance between 0C and 7C into the circuit, where C represents the value of the unit capacitor. In practice this can be implemented with unit capacitors.

Other ways of changing the bandwidth of the amplifier might also be exploited. For example the amplifier might be implemented as two parallel amplifiers with respective bandwidths, and then one or other of these could be selectively depowered when not required.

Figure 9:
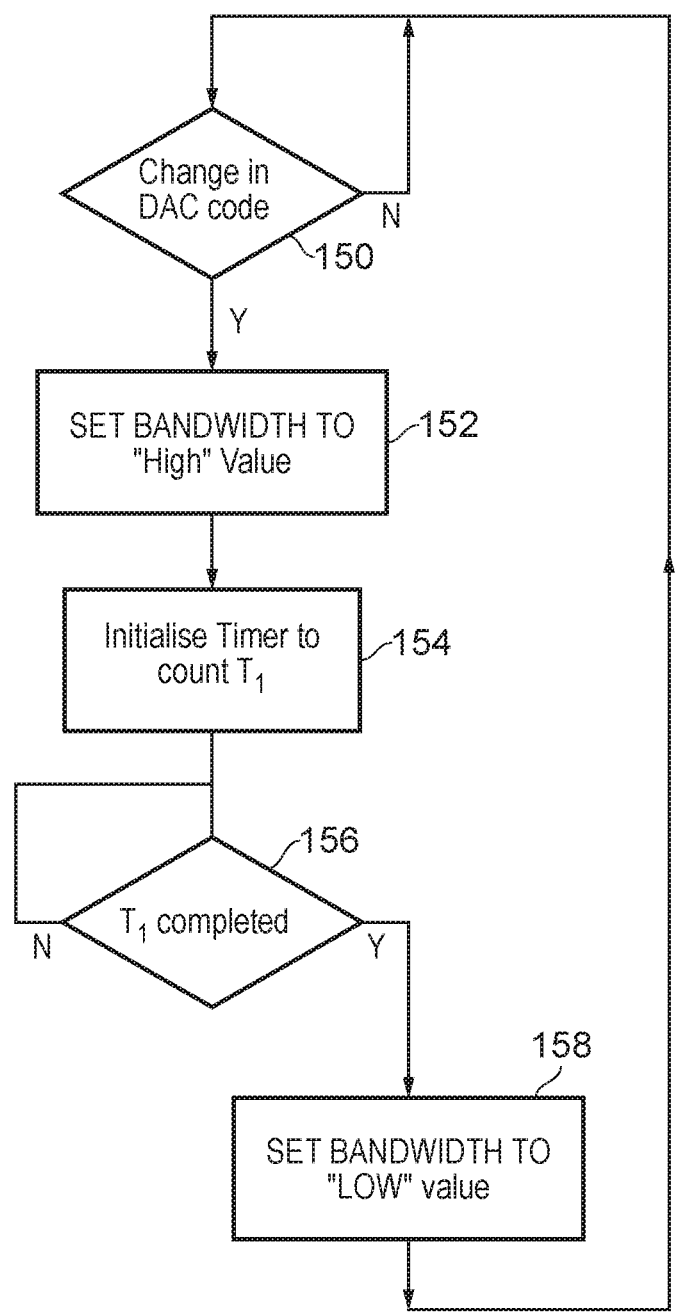
FIG. 9 illustrates a flow chart for implementing a controlscheme in accordance with the teachings of this disclosure.

FIG. 9 is a flow chart of a method that may be implemented where a buffer is driven by a DAC to provide a reference voltage that is held constant for periods of time. The control method starts at step 150 where the method looks for a change in the input code presented to the DAC. This may be done in hardware of software by, for example, comparing the present DAC input code with a preceding one. If a change is detected in the input code control, the system moves to step 152 where the filter 50 is set to a high bandwidth value. Control is then passed to step 154 where a timer is set to time a period T1 set by the designer or user (as appropriate). Step 156 monitors for the expiry of the period T1 and once this has expired, control is passed to step 158 where the components of the filter 50 are set so as to return the bandwidth to a "low" value.

Other ways of adjusting the amplifier bandwidth have been discussed earlier. One method, namely varying bias currents, will now be discussed in further detail.

Figure 10:
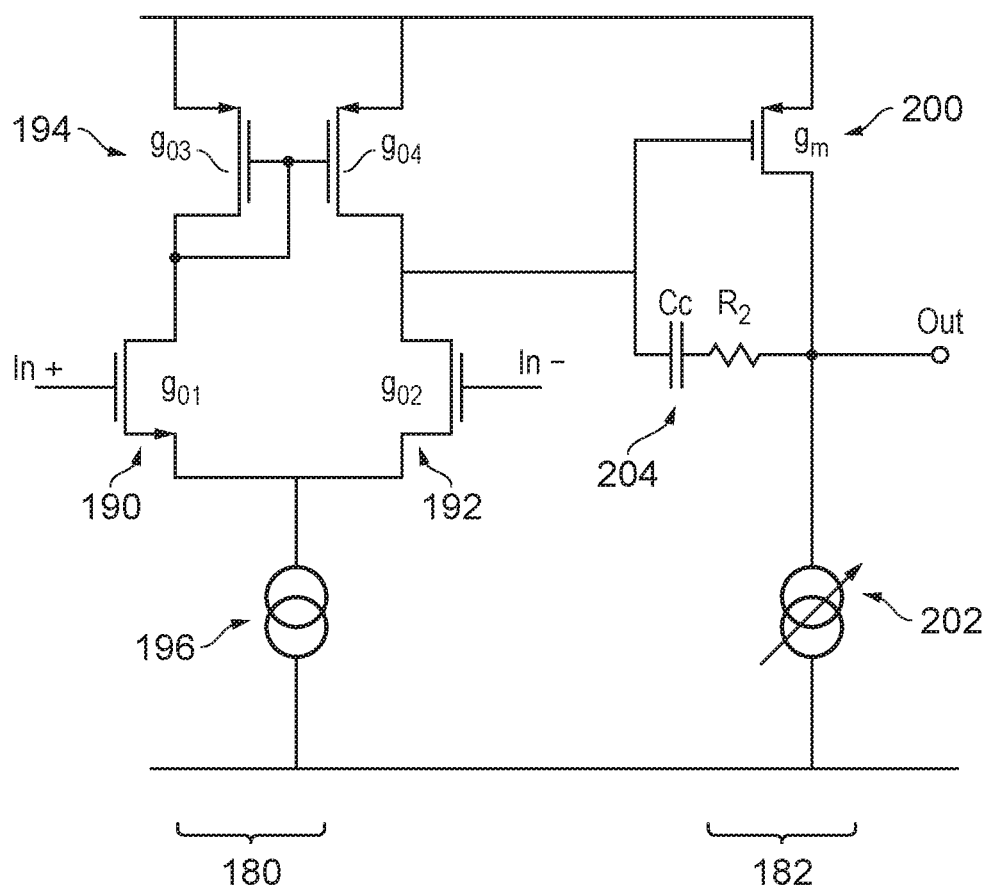
FIG. 10 illustrates an amplifier with internally adjustable bandwidth.

FIG. 10 shows a simple two stage amplifier comprising a first stage 180 and a second stage 182. The amplifier schematic has been kept very simple and hence features such as cascode transistors or folded cascode stages have been omitted so as to avoid further complicating the circuit and hence obscuring the teachings that we wish to make. The first stage 180 comprises transistors 190 and 192 arranged as a differential pair with an active load 194. The current through the differential pair is set by a current sink 196. The second stage 182 comprises an output stage 200 in series with a current sink 202. The amplifier also includes a compensation capacitor 204 connected as shown to keep the amplifier stable in a voltage follower (unity gain) configuration The current sink 202 sets the drain current for the transistor 200.

In the Shichman-Hodges model the transconductance $g_m$ of a MOSFET in strong inversion operation is expressed as $$g_m = 2I_D/V_{\textit{eff}}$$

where $I_D$ is the drain current and $V_{\textit{eff}}$ represents the voltage difference between the bias point gate-source voltage and the threshold voltage for the transistor.

Thus controlling the current passed though the current sink 202 controls the gain of the second stage. However this also changes the bandwidth of the amplifier as the dominant pole ωd in the frequency response is expressed as $$\omega Id = A/g_{m2} \cdot Cc$$

where $g_{m2}$ is the transconductance of the second stage transistor 200, Cc is the capacitance of the compensation capacitor 204, and A represents the contribution to transconductance from the first stage 180. Thus the controller 60 from FIG. 6 could be arranged to vary bias currents within the amplifier 12 instead of or in addition to modifying the filter 50. If bias current control is implemented the filter 50 may be dispensed with.

Whilst the above discussion relates to FETs in strong inversion, it should be noted that FETs can be operated in weak or moderate inversion as well as velocity saturation regions of operation with corresponding changes to the operating characteristic.

Figure 11:
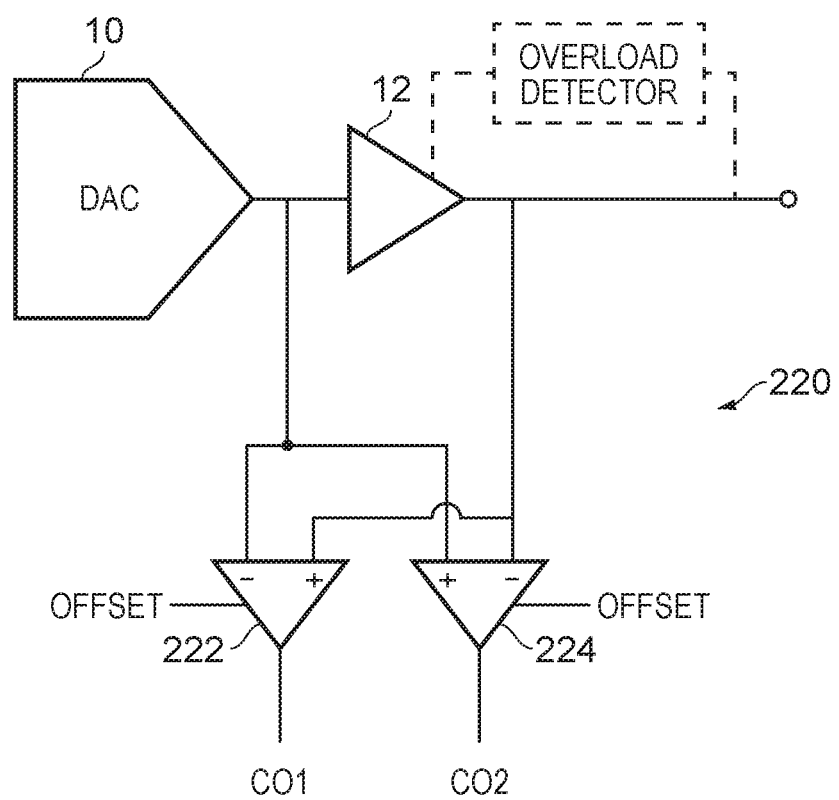
FIG. 11 schematically illustrates an embodiment of the present disclosure where a window comparator is used to assess whether the bandwidth of the buffer amplifier (or associated filters) needs to be modified.

As noted earlier, changes to the load presented to the buffer amplifier 12 may require it to respond in such a way that a change of bandwidth is appropriate. FIG. 11 schematically illustrates an arrangement in which a digital to analog converter drives a buffer amplifier 12 as described hereinbefore. The buffer amplifier 12 may be associated with a controllable filter 50 as described with respect to FIG. 6 or its bandwidth may be internally adjustable. The bandwidth controller, for example item 60 of FIG. 6 may further be responsive to a window comparator generally indicated 220 made up of the first and second comparators 222 and 224, each of which may also receive a respective offset signal. The comparators 222 and 224, together with their respective offsets, enable the test to be made to determine whether the voltage at the output of the amplifier 12 is sufficiently close to the voltage at the input of the amplifier 12 for these voltages to be deemed equivalent. However the comparator 220 can also determine if the output voltage differs from the input voltage by more than a predetermined amount, and if so it can assert a signal to the controller. The controller may then respond to the signal by modifying the operation of the buffer amplifier 12, for example by increasing the bandwidth of the amplifier temporarily such that the feedback loop can bring the voltages at the output and the input of the amplifier 12 back to within a desired range of each other. The arrangement shown in FIG. 11 may also include an overload detector and limiting circuit, for example as taught in U.S. Pat. No. 7,369,385.

Figure 12:
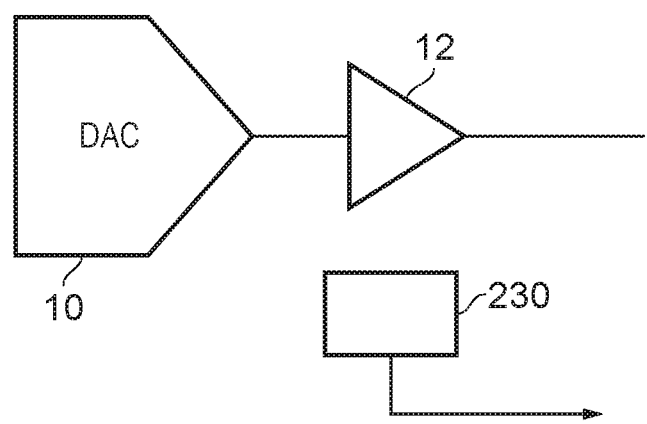
FIG. 12 schematically illustrates an embodiment of the present disclosure where thermal properties are used to infer how hard the amplifier is working, and are used to modify the bandwidth of the amplifier (or associated filters).

The arrangement shown in FIG. 11 represents a direct method for determining whether the amplifier bandwidth should be modified. By contrast, FIG. 12 illustrates an arrangement using an indirect method. The amplifier 12 is associated with a temperature sensor 230. The heat generated by the output stage of the amplifier 12 can be used to infer how hard the amplifier is working. Thus if the output load becomes more variable, then the amplifier can be expected to work harder and its output transistors will get warmer. This is detected by the temperature sensor 230 and the information passed to a controller which can then take appropriate steps. Such steps may initially include increasing the bandwidth around the amplifier so that it can adapt to the changing load. However, if the temperature of the output stage becomes critical and steps may be taken to protect the buffer amplifier from failure. These may include reducing its bandwidth or even switching if off and setting an alert.

It is thus possible to provide a method and apparatus for dynamically varying the bandwidth of a buffer amplifier and thereby to vary the noise power introduced into a circuit which receives a signal from the combination of the buffer amplifier 12 and the digital to analog converter 10, such that the noise power can be reduced when the signal from the DAC is not changing or is only changing in response to frequency components which do not require the full bandwidth of the amplifier in order to give an acceptable response or precision. The discussion has been set in the context of MOSFET devices. Additionally although the "M" in MOSFET stood for metal gate material, it has been long replaced in practice by polycrystalline silicon with a Silicon Dioxide insulator layer, and more recently this pairing has been replaced by high dielectric permittivity, hi-K or high-$\varepsilon_R$, dielectric in combination with a metal gate on newer technologies. However the teachings are equally applicable to junction FETs, multi-gate devices, horizontal or vertical devices, finFETs and so on.

The claims presented here are in single dependency format suitable for filing with the USPTO but it should be understood that any claim can depend on any preceding claim unless that is clearly infeasible.

The invention claimed is:

1. A circuit for controlling a noise level in a signal chain including an amplifier, the circuit comprising:
    a digital to analog converter coupled to an input of the amplifier;
    a filter circuit coupled to an output of the amplifier; and
    a controller coupled to receive one or more of:
        an input of the digital to analog converter;
        an input of the amplifier; and
        an output of the amplifier,
    wherein the controller is configured to adjust a low pass small signal bandwidth of the amplifier using one or more of the input of the digital to analog converter, the input of the amplifier, and the output of the amplifier.

2. The circuit of claim 1 in which the controller monitors a signal at the output of the amplifier and adjusts the bandwidth based on the signal.

3. The circuit of claim 1 in which the controller is configured to adjust a bandwidth at an output stage of the amplifier.

4. The circuit of claim 3, in which the controller configured to adjust the bandwidth at the output stage of the amplifier is configured to vary a time constant of a low pass filter at the output of the amplifier.

5. The circuit of claim 1, in which the controller is configured to adjust bias currents within the amplifier.

6. The circuit of claim 1, in which the controller is configured to adjust a transconductance in the amplifier.

7. The circuit of claim 1, further comprising:
    an analog to digital converter arranged to monitor the output of the amplifier, and the controller includes a circuit responsive to the analog to digital converter to estimate noise at the amplifier output.

8. The circuit of claim 1, in which the bandwidth of the amplifier is set to a first value in a first period in response to a change in the digital to analog converter input or output, and is set to a second value smaller than the first value following a predetermined setting time.

9. The circuit of claim 1, further comprising a circuit configured to monitor a voltage difference across the amplifier, and vary the bandwidth of the amplifier in response to the voltage difference.

10. The circuit of claim 3, further comprising a circuit configured to monitor a voltage difference between an input to the amplifier and an output of the filter, and increase the filter bandwidth when the voltage difference exceeds a threshold.

11. The circuit of claim 1, in which the controller is configured to adjust a capacitance in the amplifier.

12. A method of controlling noise levels in a signal chain including of an amplifier, the method comprising:
    receiving one or more of an input of a digital to analog converter, an input of the amplifier, and an output of the amplifier; and
    using one or more of the input of the digital to analog converter, the input of the amplifier, and the output of the amplifier, adjusting a small signal bandwidth of the amplifier to reduce noise when the input to the amplifier is substantially constant, and increasing the small signal bandwidth when a change in the input signal occurs.

13. The method of claim 12, wherein a controller is responsive to change in an input word of the digital to analog converter, the method further comprising:
    adjusting the bandwidth of a buffer to set it to a first value when a code change occurs, and to set it to a second value lower than the first value a predetermined time period after a code change occurred.

14. The method of claim 13, further comprising:
    analyzing a frequency content of the signals at the input or the output of the digital to analog converter and adjusting the bandwidth of the buffer based on the frequency content.

15. The method of claim 12, wherein adjusting the small signal bandwidth of the amplifier includes adjusting a capacitance in the amplifier.

16. A method of controlling noise power at an output of an amplifier, the method comprising:

receiving one or more of an input of a digital to analog converter, an input of the amplifier, and an output of the amplifier; and using one or more of the input of the digital to analog converter, the input of the amplifier, and the output of the amplifier, adjusting a bandwidth of the amplifier or the bandwidth of an output stage filter of the amplifier to reduce noise when conditions at an output of the amplifier are substantially constant, and increasing the bandwidth to facilitate a change at the output when a change is required, occurring or about to occur, wherein adjusting the bandwidth includes:

setting the bandwidth of the amplifier to a first value in a first period in response to a change in the digital to analog converter input or output, and setting the bandwidth of the amplifier to a second value smaller than the first value following a predetermined settling time.

17. The method of claim 16, wherein a change at the output of the amplifier is in response to a change at an input to the amplifier, or at a device upstream of the amplifier.

18. The method of claim 16, in which a change at the output of the amplifier results from a modification of the load presented to the amplifier or output stage filter.

19. The method of claim 16, further comprising examining a voltage difference across the amplifier or amplifier and filter combination and increasing the bandwidth if the difference exceeds the threshold value.

20. The method of claim 16, wherein adjusting the bandwidth includes adjusting a capacitance in the amplifier.

* * * * *